United States Patent
Chen et al.

(10) Patent No.: US 6,403,882 B1
(45) Date of Patent: *Jun. 11, 2002

(54) PROTECTIVE COVER PLATE FOR FLIP CHIP ASSEMBLY BACKSIDE

(75) Inventors: William Tze-You Chen, Endicott; Michael Anthony Gaynes, Vestal; Eric Arthur Johnson, Greene; Tien Yue Wu, Endwell, all of NY (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/884,796

(22) Filed: Jun. 30, 1997

(51) Int. Cl.$^7$ .................................................. H01L 23/02
(52) U.S. Cl. ................ 174/52.4; 174/35 R; 174/35 MS; 174/261; 361/753; 361/799; 361/800; 361/816; 361/818; 257/659; 257/660; 257/700; 257/707; 257/708; 257/712; 438/108
(58) Field of Search ................................. 257/659, 660, 257/791, 700, 707, 708, 712; 174/35 R, 35 MS, 52.4, 261; 361/753, 799, 800, 816, 818; 438/108

(56) References Cited

U.S. PATENT DOCUMENTS

| | | | |
|---|---|---|---|
| 4,388,132 A | | 6/1983 | Hoge et al. ................. 156/153 |
| 4,535,350 A | * | 8/1985 | Goodrich et al. ............ 357/74 |
| 4,795,680 A | * | 1/1989 | Rich et al. .................. 428/450 |
| 4,933,042 A | | 6/1990 | Eichelberger et al. ...... 156/239 |
| 5,249,101 A | * | 9/1993 | Frey et al. .................. 174/52.2 |
| 5,331,513 A | | 7/1994 | Hirai et al. .................. 367/760 |
| 5,349,500 A | * | 9/1994 | Casson et al. ............... 361/749 |
| 5,390,082 A | * | 2/1995 | Chase et al. ................ 174/52.2 |
| 5,414,928 A | * | 5/1995 | Bonitz et al. ................. 29/840 |
| 5,438,216 A | * | 8/1995 | Juskey et al. ................ 257/433 |
| 5,641,946 A | * | 6/1997 | Shim .......................... 174/261 |
| 5,710,071 A | * | 1/1998 | Beddingfield et al. ....... 438/108 |
| 5,773,884 A | * | 6/1998 | Andros et al. ............... 257/707 |
| 5,847,929 A | * | 12/1998 | Bernier et al. ............... 361/719 |
| 5,856,911 A | * | 1/1999 | Riley .......................... 361/704 |
| 5,889,332 A | * | 3/1999 | Lawson et al. .............. 257/778 |
| 5,933,713 A | * | 8/1999 | Farnworth ................... 438/106 |
| 6,294,405 B1 | * | 9/2001 | Higgins, III ................. 257/782 |
| 2001/0017413 A1 | * | 8/2001 | Jiang et al. .................. 257/737 |
| 2002/0019073 A1 | * | 2/2002 | Moon .......................... 438/107 |

FOREIGN PATENT DOCUMENTS

| | | |
|---|---|---|
| JP | 1235261 | 9/1989 |
| JP | 6310564 | 11/1994 |

OTHER PUBLICATIONS

Page 168 from Webster Dictionary, tenth edition, 1977.*

* cited by examiner

*Primary Examiner*—William A. Cuchlinski, Jr.
*Assistant Examiner*—Ronnie Mancho
(74) *Attorney, Agent, or Firm*—Ratner & Prestia; Lawrence R. Fraley, Esq.

(57) ABSTRACT

A chip package includes a die having an active surface and an inactive surface. An adhesive is formed on the inactive surface where the adhesive has a low Young's modulus of elasticity. The low Young's modulus of elasticity may be 10,000 psi or less; 1,000 psi or less; or, preferably, about 1,000 psi. Further, the adhesive may include a thermal conducting material. A protective plate is coupled to the inactive surface using the adhesive and a chip carrier is coupled to the active surface of the die.

24 Claims, 3 Drawing Sheets ated from each other with regard to shear stresses which are developed, for example, by thermal cycling.

PROTECTIVE COVER PLATE FOR FLIP CHIP ASSEMBLY BACKSIDE

FIELD OF THE INVENTION

The present invention relates to semiconductor devices and, more particularly, to a method and apparatus for protecting a semiconductor device.

BACKGROUND OF THE INVENTION

FIG. 5 illustrates a conventional chip package 300. Typically, as shown in FIG. 5, the active surface 325 of a memory die 305 is flip chip attached to a chip-carrier 310 formed from printed circuit laminates. The inactive surface 320 of the memory die 305 is exposed and, thus, prone to handling-induced damage. The inactive surface 320 does not include interconnections to electrically couple the memory die 305 to other components. The active surface 325 of the memory die 305 is coupled to the chip carrier 310 by a C4 array 315 (i.e., an array of solder interconnections). The active surface 325 includes interconnections to be electrically coupled to other components.

The memory die 305 has a very low thermal coefficient of expansion while the chip carrier 310 has a very high thermal coefficient of expansion. As a result, after the memory die 305 has been coupled to the chip carrier 310 and allowed to cool to room temperature, the memory die 305 bends so that the center of the memory die 305 moves away from the chip carrier 310 in the direction of arrow A1. The peripheral area of the memory die 305 moves towards the chip carrier 310 in the direction of arrows A2. Consequently, the memory die 305 deflects, causing the memory die 305 to have an arcuate shape. This creates a large amount of shear between the memory die 305 and the chip carrier 310 which may cause the C4 array 315 to fail.

To prevent the C4 array 315 from failing, an expoxy 330 is applied between the chip carrier 310 and the memory die 305. As a result, the memory die 305 and the chip carrier 310 are more strongly coupled together. Thus, the memory die 305 is further deflected, causing the inactive surface 320 of the memory die 305 to be under tension. If there are flaws in the inactive surface 320, the memory die 305 may fracture. Typically, flaws in the inactive surface 320 of the die occur from pick-and-place machines used to move the memory die 305 or from handling of the memory die 305. Inadvertent nicks and scratches on the memory die 305 can cause the flaws which result in incipient die cracking and, ultimately, catastrophic function failure of memory die 305.

Thus, it is an object of the present invention to prevent the die from being damaged. It is a further object of the present invention to protect the die without exerting further forces on the die that could cause the die to fail.

SUMMARY OF THE INVENTION

To achieve these and other objects, and in view of its purposes, the present invention provides a chip package that includes a die having an active surface and an inactive surface. An adhesive is formed on the inactive surface where the adhesive has a low Young's modulus of elasticity. The low Young's modulus of elasticity may be 10,000 psi or less, or 1,000 psi or less. Further, the adhesive may include a thermal conducting material. A protective plate is disposed on the inactive surface using the adhesive and a chip carrier is coupled to the active surface of the die.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DETAILED DESCRIPTION OF THE INVENTION

Figure 1:
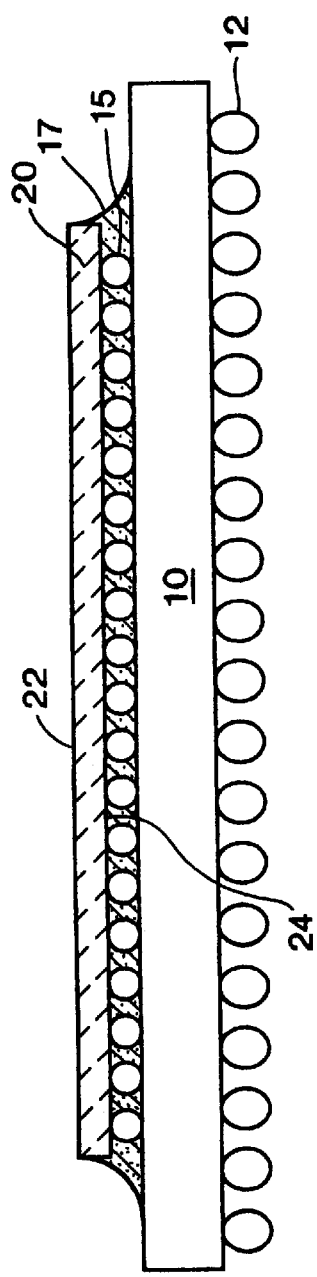
FIGS. 1–3 are schematic diagrams illustrating a chip package during successive steps of manufacture according to an exemplary embodiment of the present invention.
Figure 2:
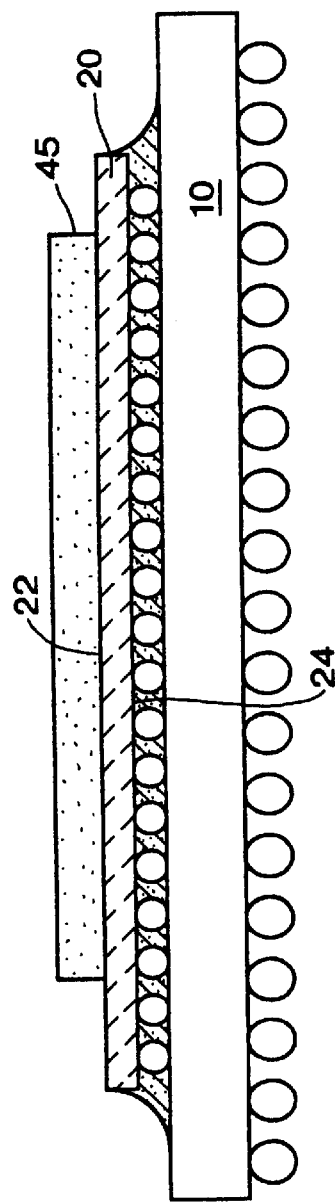
Figure 3:
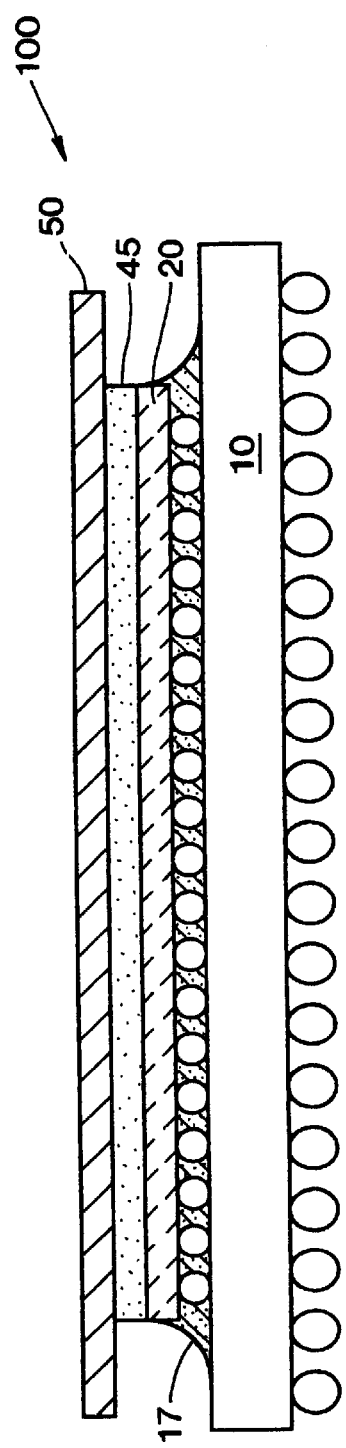
Figure 4:
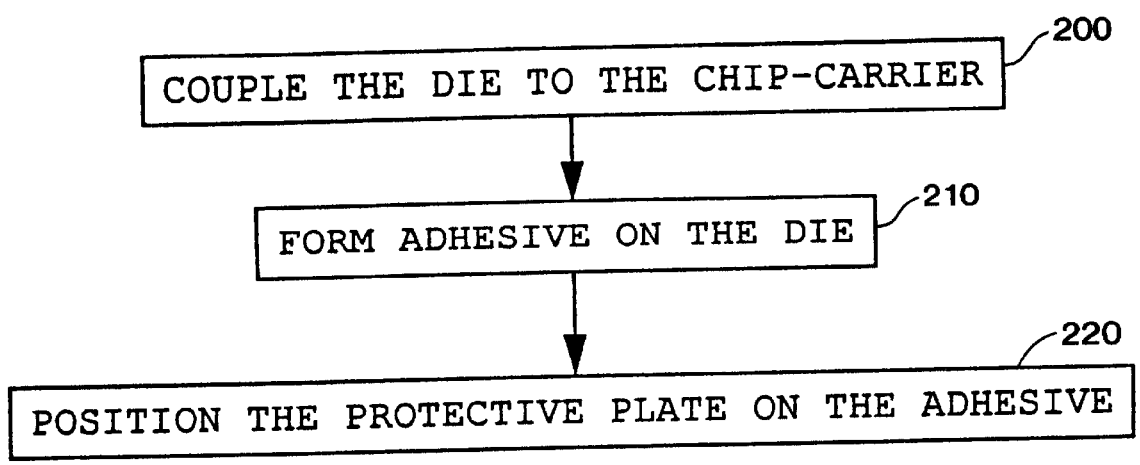
FIG. 4 is a flow chart illustrating the manufacturing process used to produce the chip package shown in FIGS. 1–3.
Figure 5:
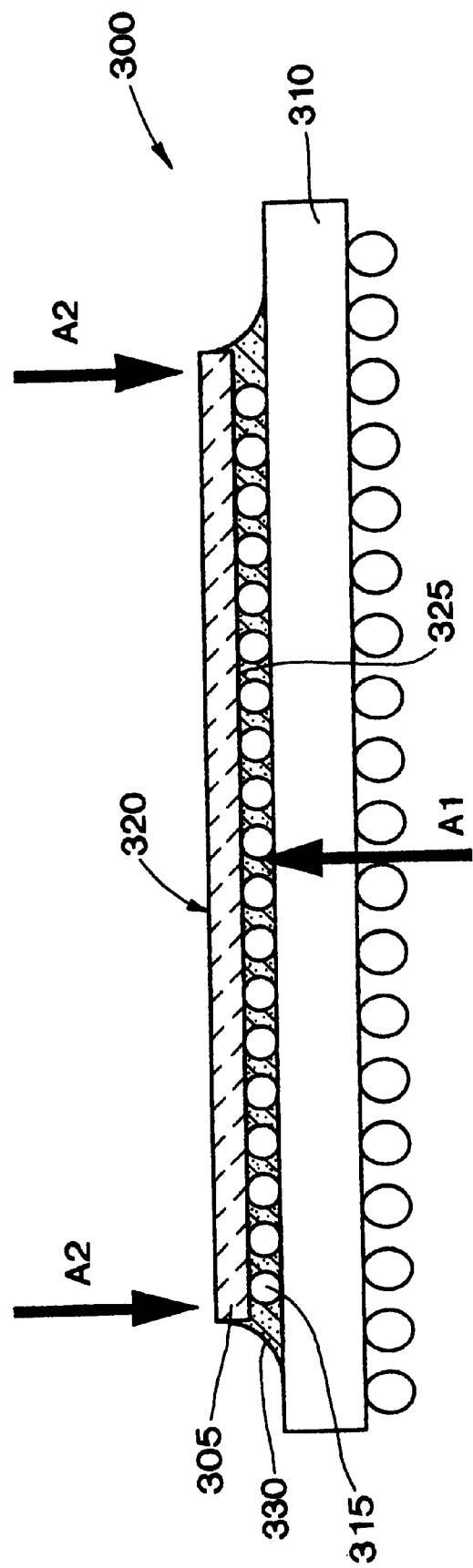
FIG. 5 is a schematic diagram of the chip package according to the prior art.

Referring now to the drawing, wherein like reference numerals refer to like elements throughout, FIGS. 1–3 are schematic diagrams illustrating a chip package 100 during successive steps of manufacture according to an exemplary embodiment of the present invention. The manufacturing process for producing the chip package 100, shown in FIGS. 1–3, is described below with reference to FIG. 4.

At step 200, a die 20 coupled to a chip carrier 10 is provided. A ball grid array (BGA) 12 is formed on the chip carrier 10. The die 20 is, for example, a memory die. The die 20 is electrically coupled to the chip carrier 10 via a C4 array 15. The die 20 has a very low thermal linear coefficient of thermal expansion of 1 to 3 ppm/° C (parts per millon/°C.). The chip carrier 10 has a very high thermal coefficient of expansion 10 to 25 ppm/° C. As a result, after the die 20 has been coupled to the chip carrier 10 and allowed to cool to room temperature, the die 20 bends so that the center of the die moves away from the chip carrier 10 and the ends of the die move towards the chip carrier 10. An epoxy 17 is flowed between the chip carrier 10 and the die 20.

At step 210, an adhesive 45 is formed in an X-pattern on the inactive surface 22 of the die 20. The X-pattern allows air to escape when the protective plate 50 is pressed against the adhesive 45. Alternatively, the pattern may be a dot dispensed in the center of the inactive surface 22 or a line-pattern extending from one end to the other end of the inactive surface 22. The adhesive 45 has a low Young's modulus of elasticity of 10,000 psi or less. Alternatively, the Young's modulus of elasticity of the adhesive 45 may be 1,000 psi or less. Further, the Young's modulus of elasticity of the adhesive 45 may be approximately 1,000 psi. By selecting a material for the adhesive 45 having a low Young's modulus of elasticity, the protective plate 50 may be substantially mechanically decoupled from the die 20.

Materials having a high modulus of elasticity such as the epoxy 17 are not suitable for use as the adhesive 45. The flip chip encapsulation process for attaching the die 20 to the chip carrier 10 uses an epoxy that has a Young's modulus of elasticity of at least 500,000 psi and, more typically, greater than 1,000,000 psi. High Young's modulus of elasticity materials cause a large amount of tensile stresses on the edges of the chip. When the protective plate 50 and the chip carrier 10 are attached to the die 20 using a high Young's modulus of elasticity material, the chip package 100 remains substantially flat. In other words, the protective plate 50 and the chip carrier 10 are mechanically coupled to the die 20.

As a result, an upward directed normal force is applied to the inactive surface 22 of the die 20 while a downward directed force is applied to the active surface 24 of the die 20. As a result, the likelihood increases that the die 20 may fracture into two halves.

The adhesive 45 is selected so that it remains stable during subsequent processing of the chip package 100 at elevated temperatures. For example, the adhesive 45 is selected to remain stable at temperatures of up to approximately 240° C. The chip package 100 is exposed to temperatures of up to 240° C. during subsequent solder reflowing steps to attach the chip package 100 to, for example, a printed circuit board. As used in this document, "stable" means that adhesive 45 (1) maintains its bond to the protective plate 50 and the chip carrier 10, and (2) retains its Young's modulus of elasticity.

An exemplary adhesive 45 is silicone. Another material suitable for use as the adhesive 45 is available from General Electric Company under part number TC3280G. A filler may be dispersed in the adhesive 45 to increase the thermal conductivity of the adhesive 45. In this way, intimate thermal contact between the die 20 and the protective plate 50, shown in FIG. 3, is formed to conduct heat from the die 20 to the protective plate 50. The filler is selected to provide thermal conductivity and is, for example, silver, silicone dioxide, or alumina, aluminum nitride, zinc oxide or boron nitride.

At step 220, the protective plate 50, shown in FIG. 3, is pressed against the adhesive 45 to fix the protective plate 50 to the die 20. Sufficient adhesive 45 is applied to the inactive surface 22 so that the adhesive 45 is spread across the surface of the die 20 covering, for example, at least 70% of the inactive surface 22 when the protective plate 50 is pressed against the adhesive 45.

The thickness of the adhesive 45 between the die 20 and the protective plate 50 is 0.051 to 0.076 mm (2 to 3 mils; a mil is 1/1000 of an inch). The thickness of the adhesive 45 may be larger or smaller but is selected to maintain thermal conductance between the die 20 and the protective plate 50. If the thickness of the adhesive 45 is increased too much, the thermal conducting properties of the adhesive 45 may be reduced. The thickness of the adhesive 45 is also selected to maintain the adhesive properties of the adhesive 45. If the thickness of the adhesive 45 is reduced too much, the adhesive 45 may not maintain the bond between the die 20 and the protective plate 50.

The protective plate 50 may be a metal such as stainless steel, copper, aluminum, iron nickel alloy (an alloy of 42% nickel), phosphor bronze, or iron. Because of the thermal conductance of the protective plate 50 and intimate thermal contact between the die 20 and the protective plate 50, the protective plate 50 acts as a heat spreader which increases the thermal performance of the chip package 100.

The protective plate 50. may have a thickness of 0.18 or 0.2 mm (7 or 8 mils). The other dimensions of the plate 50 are selected so that the protective plate 50 covers the inactive surface 22 of the die 20. Alternatively, the protective plate 50 may be larger or smaller than inactive surface 22 of the die 20. The protective plate 50 prevents the inactive surface 22 from being damaged.

Although illustrated and described herein with reference to certain specific embodiments, the present invention is nevertheless not intended to be limited to the details shown. Rather, various modifications may be made in the details within the scope and range of equivalents of the claims and without departing from the spirit of the invention. For example, the protective plate 50 may be coupled to the die 20 before the die 20 is coupled to the chip carrier 10.

What is claimed:

1. A chip package comprising:
   a die having an active surface;
   an adhesive formed on the die, the adhesive having a low modulus of elasticity of up to and including about 10,000 psi;
   a protective plate on the die using the low modulus of elasticity adhesive thereby the protective plate is adapted to substantially mechanically decouple from the die, and
   a chip carrier having a higher thermal coefficient of expansion than the die, and the chip carrier having a surface and being adhesively bonded at the surface to the entire active surface of the die and opposite the protective plate, and the chip package thereby prevents a bending interaction of the die between the chip, carrier and the protective plate to minimize horizontal chip cracking.

2. The chip package according to claim 1, wherein the adhesive includes a thermal conducting material.

3. The chip package according to claim 2, wherein the conducting material is selected from the group consisting of silver, silicone dioxide, and alumina.

4. The chip package according to claim 1, wherein the adhesive is stable at temperatures up to 240° C.

5. The chip package according to claim 1, wherein the adhesive has a modulus of elasticity of up to and including about 1,000 psi.

6. The chip package according to claim 5, wherein the adhesive includes a thermal conducting material.

7. The chip package according to claim 6, wherein the conducting material is selected from the group consisting of silver, silicone dioxide, and alumina.

8. The chip package according to claim 5, wherein the adhesive is stable at temperatures up to 240° C.

9. The chip package according to claim 1, wherein the protective plate is a metal.

10. The chip package according to claim 1, wherein the adhesive is silicone.

11. The chip package according to claim 1, wherein the adhesive includes a thermal conducting material.

12. The chip package according to claim 1, wherein the die has an active surface and an inactive surface and the adhesive is formed on the inactive surface.

13. The chip package according to claim 1, wherein the die has an inactive surface which has a first size and the protective plate has a second size that is greater than or equal to the first size.

14. A chip package comprising:
    a die having an active surface and an inactive surface;
    an adhesive formed on the inactive surface and the adhesive has a modulus of elasticity up to and including about 10,000 psi;
    a protective plate on the inactive surface using the low modulus of elasticity adhesive thereby the protective plate is adapted to substantially mechanically decouple the from the die; and
    a chip carrier having a higher thermal coefficient of expansion than the die, and the chip carrier spaced from and opposite the protective plate, the chip carrier having a surface and being adhesively bonded at the surface to the entire active surface of the die so as to be spaced from and opposite the protective plate, and the chip package thereby prevents a bending interaction of the die between the chip carrier and the protective plate to minimize horizontal chip cracking.

15. The chip package according to claim 14, wherein the adhesive is stable at temperatures up to 240° C.

16. The chip package according to claim 15, wherein the adhesive has a modulus of elasticity of up to and including 1,000 psi.

17. The chip package according to claim 16, wherein the adhesive includes a thermal conducting material.

18. The chip package according to claim 16, wherein the adhesive is stable at temperatures up to 240° C.

19. The chip package according to claim 14, wherein the protective plate is a metal.

20. The chip package according to claim 14, wherein the adhesive is silicone.

21. The chip package according to claim 14, wherein the adhesive includes a thermal conducting material.

22. The chip package according to claim 14, wherein the inactive surface has a first size and the protective plate has a second size that is greater than or equal to the first size.

23. A chip package comprising:
   a die having an active surface;
   an adhesive formed on the die, the adhesive having a low modulus of elasticity of up to and including about 10,000 psi;
   a protective plate on the die using the low modulus of elasticity adhesive thereby the protective plate is adapted to substantially mechanically decouple from the die; and
   a chip carrier having a higher thermal coefficient of expansion than the die, and the chip carrier entirely spaced from and opposite to the protective plate, the chip carrier having a surface and being adhesively bonded to the entire active surface of the die so as to be spaced from and opposite the protective plate, and the chip package thereby prevents a bending interaction of the die between the chip carrier and the protective plate to minimize horizontal chip cracking.

24. A chip package comprising:
   a die having an active surface;
   an adhesive formed on the die, the adhesive having a low modulus of elasticity of up to and including about 10,000 psi;
   a protective plate on the die using the low modulus of elasticity adhesive thereby the protective plate is adapted to substantially mechanically decouple from the die, and
   a chip carrier having a higher thermal coefficient of expansion than the die, and the chip carrier having a surface and being adhesively bonded by an epoxy at the surface to the entire active surface of the die and opposite the protective plate, and the chip package thereby prevents a bending interaction of the die between the chip carrier and the protective plate to minimize horizontal chip cracking.

* * * * *